(12) United States Patent
Tomooka et al.

(10) Patent No.: US 11,852,510 B2
(45) Date of Patent: Dec. 26, 2023

(54) SENSOR AND METHOD FOR MANUFACTURING THE SAME

(71) Applicant: SEKISUI POLYMATECH CO., LTD., Saitama (JP)

(72) Inventors: Shinichi Tomooka, Saitama (JP); Yasushi Sakai, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 170 days.

(21) Appl. No.: 17/414,417

(22) PCT Filed: Dec. 23, 2019

(86) PCT No.: PCT/JP2019/050275
§ 371 (c)(1),
(2) Date: Jun. 16, 2021

(87) PCT Pub. No.: WO2020/137938
PCT Pub. Date: Jul. 2, 2020

(65) Prior Publication Data
US 2022/0090944 A1    Mar. 24, 2022

(30) Foreign Application Priority Data

Dec. 28, 2018 (JP) ................................ 2018-248431

(51) Int. Cl.
*G01D 5/24*      (2006.01)
*G06F 3/044*    (2006.01)
*G06F 3/041*    (2006.01)
*G01R 27/26*    (2006.01)

(52) U.S. Cl.
CPC ............ *G01D 5/24* (2013.01); *G06F 3/0445* (2019.05); *G01R 27/2605* (2013.01); *G06F 3/0446* (2019.05); *G06F 3/04164* (2019.05)

(58) Field of Classification Search
CPC ........ G01R 27/00; G01R 27/02; G01R 27/26; G01R 27/2605; G01D 5/00; G01D 5/12;
(Continued)

(56) References Cited

U.S. PATENT DOCUMENTS

2011/0181545 A1    7/2011 Takahashi et al.
2013/0082925 A1    4/2013 Sato
(Continued)

FOREIGN PATENT DOCUMENTS

CN    106133663 A  * 11/2016 ......... G06F 3/04164
CN    106463290 A     2/2017
(Continued)

OTHER PUBLICATIONS

International Search Report for PCT Patent App. No. PCT/JP2019/050275 (dated Mar. 17, 2020).

*Primary Examiner* — Hoai-An D. Nguyen
(74) *Attorney, Agent, or Firm* — Cermak Nakajima & McGowan LLP; Tomoko Nakajima

(57) ABSTRACT

A sensor includes a base member and a sensor sheet, and the sensor sheet includes a sensor main body including sensor electrodes and a tail portion that includes wiring lines electrically connected to the sensor electrodes and that projects and extends with respect to the base member. The base member includes a joint surface portion that is fixed to the sensor main body and a separation portion that is disposed at a position facing a tail support portion of the tail support portion to which the tail portion is connected and that is not fixed to the tail support portion.

17 Claims, 6 Drawing Sheets

(58) Field of Classification Search
CPC .... G01D 5/14; G01D 5/24; G06F 3/00; G06F 3/01; G06F 3/03; G06F 3/041; G06F 3/0416; G06F 3/04164; G06F 3/044; G06F 3/0445; G06F 3/0446
USPC ........ 324/600, 649, 658, 686; 702/1, 33, 47, 702/52
See application file for complete search history.

(56) References Cited

U.S. PATENT DOCUMENTS

| | | |
|---|---|---|
| 2015/0168997 A1 | 6/2015 | Matsuoka et al. |
| 2016/0162077 A1 | 6/2016 | Kiyoshi et al. |
| 2017/0090661 A1 | 3/2017 | Kim et al. |
| 2017/0123570 A1 | 5/2017 | Maruyama et al. |
| 2017/0184273 A1 | 6/2017 | Tateda |
| 2017/0371465 A1 | 12/2017 | Ahn |

FOREIGN PATENT DOCUMENTS

| | | | | |
|---|---|---|---|---|
| CN | 106662941 A | | 5/2017 | |
| CN | 103809796 B | * | 3/2018 | ............. G06F 3/044 |
| DE | 102015119272 A1 | * | 5/2017 | ........... G01L 13/025 |
| JP | 2012-141846 A | | 7/2012 | |
| JP | 2013-077271 A | | 4/2013 | |
| JP | 2013-247029 A | | 12/2013 | |
| JP | 2014-048763 A | | 3/2014 | |
| JP | 2014-235894 A | | 12/2014 | |
| JP | 2016-173737 A | | 9/2016 | |
| WO | 2015-005270 A1 | | 1/2015 | |
| WO | WO-2020004651 A1 | * | 1/2020 | ............. G01L 1/142 |

\* cited by examiner

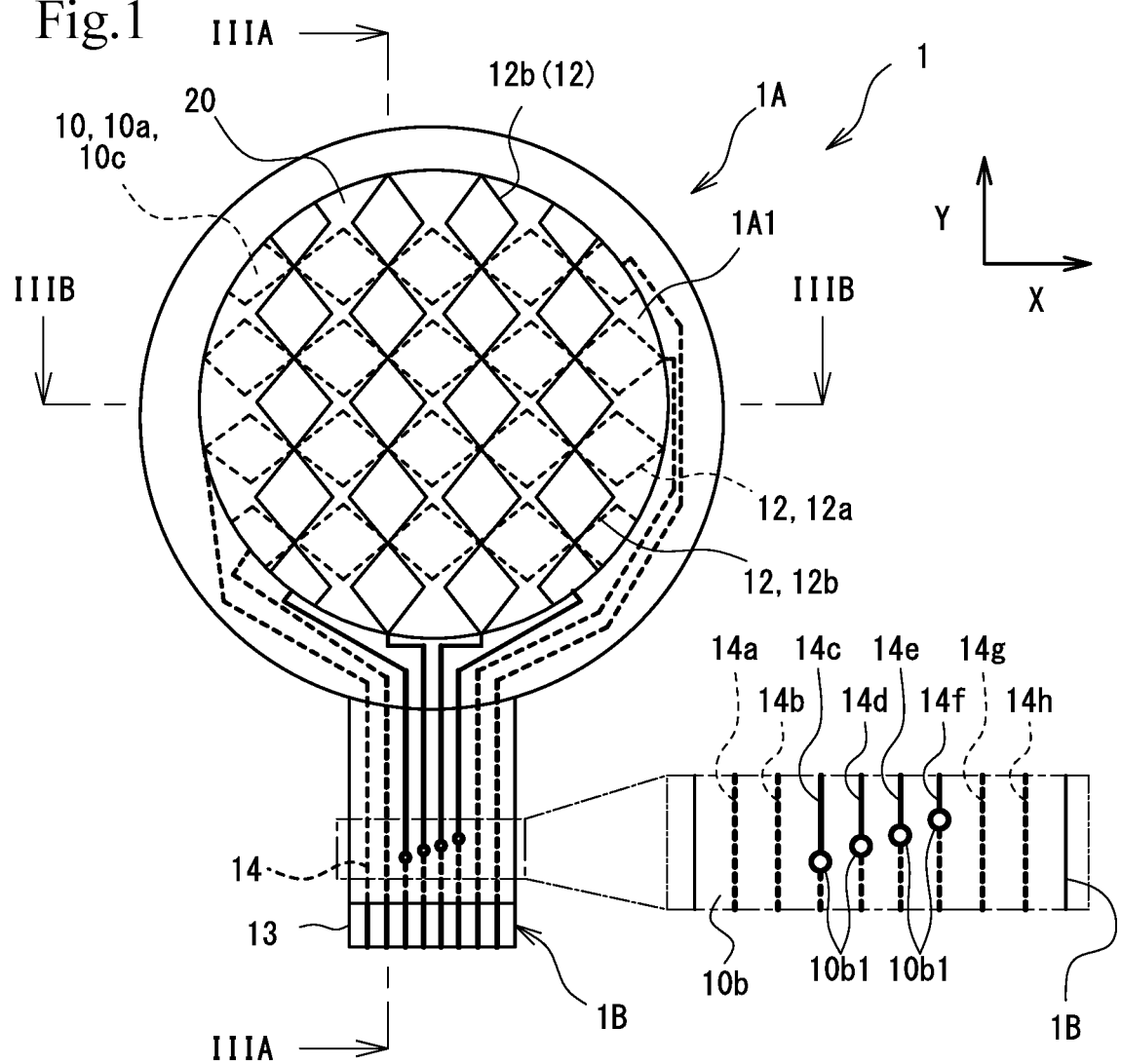
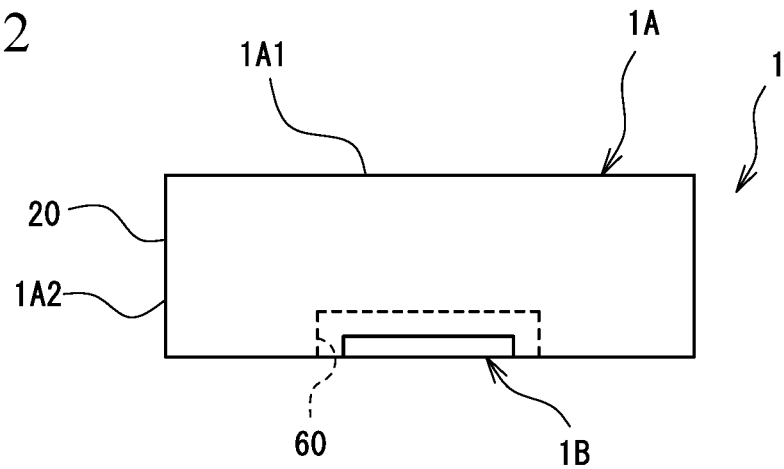

SENSOR AND METHOD FOR MANUFACTURING THE SAME

This application is a national phase entry under 35 U.S.C. § 371 of PCT Patent Application No. PCT/JP2019/050275, filed on Dec. 23, 2019, which claims priority under 35 U.S.C. § 119 to Japanese Patent Application No. 2018-248431, filed Dec. 28, 2018, both of which are incorporated by reference.

TECHNICAL FIELD

The present invention relates to a sensor such as an electrostatic capacitance sensor that is used for input operations of various electronic devices and a method for manufacturing the sensor.

BACKGROUND ART

In various electronic devices, operation devices for performing touch input operations are used. For example, an electrostatic capacitance sensor is used as a sensor that detects an input operation. The electrostatic capacitance sensor includes, for example, a base member made of a hard resin or the like and a film sheet made of a resin film. The film sheet includes a sensor main body that is held by the base member and a tail portion that projects and extends from the sensor main body.

The sensor main body is held by the base member. A plurality of sensor electrodes and wiring lines extending from the sensor electrodes are formed on the sensor main body by printing using an electroconductive ink or the like. The tail portion projects and extends from the sensor main body. In other words, the tail portion is not held by the base member in order to enable the wiring lines to be freely routed in accordance with the arrangement of components in a housing of the electronic device. The wiring lines extending from the plurality of sensor electrodes are formed in the tail portion in a continuous manner from the sensor main body. A terminal portion is formed at end portions of the wiring lines. The terminal portion is connected to a connector of a circuit board that is disposed in or on the housing of the electronic device. Such an electrostatic capacitance sensor of the related art is described in, for example, Japanese Unexamined Patent Application Publication No. 2013-247029 (PTL 1).

CITATION LIST

Patent Literature

PTL 1: Japanese Unexamined Patent Application Publication No. 2013-247029

SUMMARY OF INVENTION

Technical Problem

In an electrostatic capacitance sensor of the related art, a tail portion may sometimes be bent. For example, bending of the tail portion may occur when a terminal portion is connected to a connector during the arrangement of the electrostatic capacitance sensor in or on a housing of an electronic device. In addition, there is a case where the tail portion needs to be disposed by being intentionally bent depending on the arrangement of a circuit board. In the case where the tail portion is disposed in such a manner as to project from a rigid compact, the tail portion is bent at the boundary between the rigid compact and the tail portion, and thus, a heavy load is applied to the bent portion, so that wiring lines located at the bent portion may sometimes be turned up against a film sheet, which in turn results in breakage of the wiring lines.

The present invention has been made against the background of the related art such as that described above. It is an object of the present invention to reduce the risk of breakage of wiring lines in a sensor such as an electrostatic capacitance sensor when a tail portion extending from a sensor main body is bent.

Solution to Problem

To achieve the above-mentioned object, a sensor according to an aspect of the present invention and a method for manufacturing the sensor according to an aspect of the present invention are configured as follows.

A sensor according to an aspect of the present invention includes a base member and a sensor sheet. The sensor sheet includes a sensor main body that includes at least one sensor electrode and a tail portion that includes a wiring line electrically connected to the at least one sensor electrode and that projects and extends with respect to the base member. The base member includes a joint surface portion that is fixed to the sensor main body and a separation portion that is disposed at a position facing a tail support portion of the sensor main body to which the tail portion is connected and that is not fixed to the tail support portion.

According to the sensor of the aspect of the present invention, the sensor sheet is released from being restrained by the base member in the separation portion that is not fixed to the tail support portion, and the tail portion, which is formed at an end of the sensor sheet, is easily bendable. Thus, the risk of breakage of the wiring line can be reduced.

The separation portion can be configured as a recess that is formed by being recessed with respect to the joint surface portion. According to an aspect of the present invention, a gap can be formed between the sensor sheet and the base member. As a result of the separation portion being a recess, the sensor sheet and the base member can be physically separated from each other.

In an aspect of the present invention, the separation portion can be configured as a heat-resistant resin member that is interposed between the tail support portion and the base member. According to an aspect of the present invention, a heat-resistant resin member is interposed between the sensor sheet and the base member, and the join between the sensor sheet and the base member can be released without forming a gap.

In an aspect of the present invention, two notches can be formed in a portion of the sensor sheet, the portion facing the separation portion, so as to extend along an outer edge of the tail portion. According to an aspect of the present invention, a portion sandwiched between the two notches is released from being restrained by the base member and is easily deformable. Thus, the tail portion can be more easily deformed in the sensor, and the risk of breakage of the wiring line can be reduced.

In an aspect of the present invention, the sensor main body can be configured to have a three-dimensional shape having a top surface portion and a side surface portion. According to an aspect of the present invention, since the sensor main body has a three-dimensional shape having the top surface portion and the side surface portion, measures can be taken against the three-dimensional shape of the sensor to improve the design of the sensor. As an example, the top surface portion of the sensor main body can be formed so as to have a plane shape, a curved surface shape, or the like. The side surface portion of the sensor main body can be formed so as to have a columnar shape, the shape of a polygonal columnar outer peripheral surface, or the like.

In the aspect of the present invention, the film sheet and the base member can each be made of a light-transmitting material, and the sensor sheet can be configured to be capable of illuminating by allowing backlight to pass the sensor sheet. According to an aspect of the present invention, since the sensor sheet is capable of illuminating by allowing backlight to pass therethrough, the sensor main body can be illuminated, and an operation surface can be clearly displayed and identified even at nighttime or in a dark place.

In the aspect of the present invention, a plurality of the sensor electrodes can be configured as electrodes for an electrostatic capacitance sensor that detects a change in electrostatic capacitance. According to an aspect of the present invention, the sensor of the aspect of the present invention that has the above-mentioned characteristics can be fabricated as an electrostatic capacitance sensor.

An aspect of the present invention is a method for manufacturing a sensor that includes a base member and a sensor sheet and in which the base member, which is made of a resin material, is integrally formed with the sensor sheet, the sensor sheet including a sensor main body that includes a sensor electrode and a tail portion that includes a wiring line electrically connected to the sensor electrode and that projects and extends with respect to the base member. The method according to the aspect of the present invention includes providing a masking portion that is not fixed to the resin material on a tail support portion of the sensor main body to which the tail portion is connected, integrally forming the base member such that the base member covers the masking portion, and bending the tail portion with respect to the base member by bending the tail support portion.

According to the method for manufacturing a sensor of the aspect of the present invention, a separation portion that is not fixed to the tail support portion can be formed at a position at which a joint surface portion of the base member fixed to the sensor main body and the tail support portion of the sensor main body, to which the tail portion is connected, face each other. In the separation portion, the sensor sheet is released from being restrained by the base member, and the tail portion, which is formed at an end of the sensor sheet, is easily bendable, so that the sensor capable of reducing the risk of breakage of the wiring line can be provided.

In the aspect of the present invention, the masking portion can be a heat-resistant tape. According to an aspect of the present invention, the heat-resistant tape is not fixed to the base member, and the separation portion can be formed. In addition, according to an aspect of the present invention, the masking portion can be easily formed by the heat-resistant tape.

In the aspect of the present invention, the heat-resistant tape can be peeled off and removed after the base member has been integrally formed. According to an aspect of the present invention, since the heat-resistant tape is peeled off and removed after the base member has been integrally formed, a portion in which the heat-resistant tape is removed becomes a gap, and the portion can serve as the separation portion.

In the aspect of the present invention, the masking portion can be a coating layer made of a heat-resistant coating material. According to an aspect of the present invention, since the masking portion is a coating layer made of a heat-resistant coating material, the coating layer is not fixed to the base member, and the separation portion can be formed. In addition, in the aspect of the present invention, the masking portion can be a tape made of a viscous polymer material. In the aspect of the present invention, since the masking portion is a tape made of a viscous polymer material, when a molding time is short or when a molding temperature is low, even a non-heat-resistant tape made of a viscous polymer material is not fixed to the base member, and the separation portion can be formed.

The sensor electrode can be formed on either the front surface or the rear surface of the film sheet. In addition, the sensor electrode can be formed on both the surfaces of the film sheet. According to an aspect of the present invention, the arrangement of the sensor electrodes can be diversified, and various sensors can be realized.

The sensor main body and the base member can be configured as an integral molded body. According to an aspect of the present invention, the base member and the sensor main body form an integral member. Thus, the sensor main body can be formed so as to fit the design shape of the base member, and sensors of various designs can be realized.

The sensor according to the aspect of the present invention can include a circuit board on which a connector is mounted at a position facing a bottom surface of the base member. According to this configuration, the connector and the circuit board can be arranged in such a manner as to be close to the bottom surface of the base member, and thus, the sensor including the connector and the circuit board can be reduced in size.

The base member of the aspect of the present invention includes a top surface portion and a cylindrical side surface portion, and the tail portion of the sensor sheet can be disposed so as to face the inside of the side surface portion. According to this configuration, the tail portion is disposed in a cylindrical space inside the base member, and thus, the sensor can be reduced in size.

Advantageous Effects of Invention

According to an aspect of the present invention, the risk of breakage of wiring lines when a tail portion of a sensor sheet is bent can be reduced.

BRIEF DESCRIPTION OF DRAWINGS

FIG. 1 is a schematic plan view of an electrostatic capacitance sensor according to a first embodiment.

FIG. 2 is a schematic front view of the electrostatic capacitance sensor illustrated in FIG. 1.

DESCRIPTION OF EMBODIMENTS

Figure 3A:
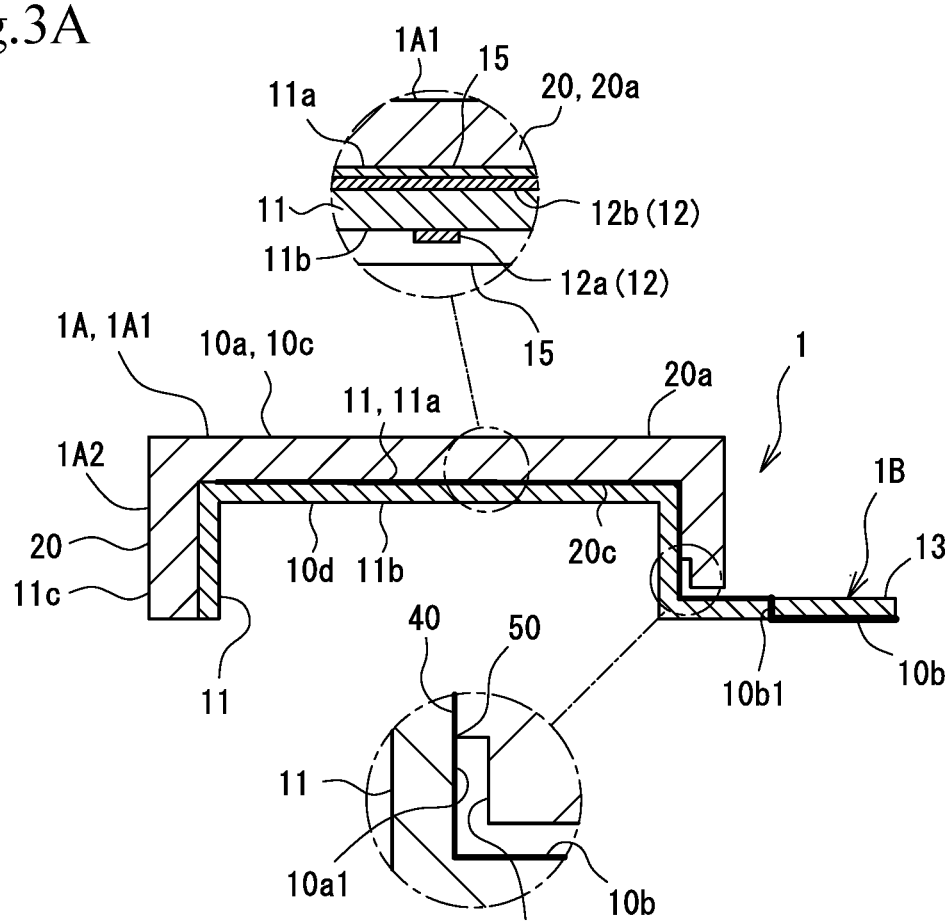
FIG. 3A is a sectional view of the electrostatic capacitance sensor taken along line IIIA-IIIA of FIG. 1.

The present invention will be described in further detail on the basis of embodiments. In each of the following embodiments, an electrostatic capacitance sensor will be described as a specific example of a sensor according to an aspect of the present invention. Note that members that are common to the embodiments are denoted by the same reference signs, and repeated descriptions will be omitted. In addition, repeated descriptions of materials, actions, effects, and so forth that are common to the embodiments will also be omitted.

First Embodiment [FIG. 1 to FIG. 4]

An electrostatic capacitance sensor 1 of the first embodiment includes a sensor sheet 10 and a base member 20.

The sensor sheet 10 includes a sensor main body 10a and a tail portion 10b. The sensor main body 10a is laminated and fixed to a top surface portion 20a of the base member 20 and a side surface portion 20b of the base member 20. The sensor main body 10a and the base member 20 form a sensing unit 1A. The tail portion 10b extends from the sensing unit 1A and forms a wiring connection portion 1B that is electrically connected to a connector 31 of a circuit board 30, the connector 31 serving as an "object to be connected".

The sensor sheet 10 includes a film sheet 11 that is made of a resin film. The film sheet 11 includes a plurality of sensor electrodes 12 formed by being laminated thereon, a terminal portion 13, and a plurality of wiring line 14 (14a to 14h). A resist layer 15 is formed on the top surface of the sensor sheet 10 so as to protect the sensor electrodes 12 and the wiring lines 14 and so as not to protect the terminal portion 13. The sensor electrodes 12, the terminal portion 13, the wiring lines 14, and the resist layer 15 are provided as print layers formed on the film sheet 11. Note that, in addition to these layers, an ultraviolet-resistant layer, a sulfurization-resistant layer, a decorative layer, a primer layer, and so forth may be formed on the sensor sheet 10.

As illustrated in FIG. 1, the plurality of sensor electrodes 12 each have a diamond-shaped surface. The plurality of sensor electrodes 12 form circuit patterns (a first circuit pattern 12a and a second circuit pattern 12b) of the electrostatic capacitance sensor 1. In FIG. 1, when the transverse direction and the vertical direction correspond to the X-axis direction and the Y-axis direction, respectively, the first circuit pattern 12a is formed of the plurality of sensor electrodes 12 that are connected to one another in such a manner that the vertices on their longer diagonal lines are contiguous to each other in the transverse direction (X-axis direction) in FIG. 1. In the first circuit pattern 12a, circuit patterns extending in the X-axis direction are arranged side by side so as to cross the Y-axis, and thus, a Y coordinate in the sensor main body 10a can be detected. The second circuit pattern 12b is formed of the plurality of sensor electrodes 12 that are connected to one another in such a manner that the vertices on their longer diagonal lines are contiguous to each other in the vertical direction (Y-axis direction) in FIG. 1. In the second circuit pattern 12b, circuit patterns extending in the Y-axis direction are arranged side by side so as to cross the X-axis, and thus, an X coordinate in the sensor main body 10a can be detected. Therefore, by combining a change in the electrostatic capacitance of the first circuit pattern 12a and a change in the electrostatic capacitance of the second circuit pattern 12b, the XY coordinates of a position at which a touch operation is performed can be detected.

As illustrated in the partially enlarged view in FIG. 3A, the first circuit pattern 12a is formed on a rear surface 11b of the film sheet 11. The second circuit pattern 12b is formed on a front surface 11a of the film sheet 11. When viewed in plan view, the first circuit pattern 12a and the second circuit pattern 12b are arranged at positions where the vertices of the diamond-shaped sensor electrodes 12 forming the first circuit pattern 12a and the vertices of the diamond-shaped sensor electrodes 12 forming the second circuit pattern 12b cross each other in a thickness direction of the film sheet 11. On the other hand, the first circuit pattern 12a and the second circuit pattern 12b are arranged in such a manner that the diamond shapes of the sensor electrodes 12 forming the first circuit pattern 12a and the diamond shapes of the sensor electrodes 12 forming the second circuit pattern 12b do not overlap each other in the thickness direction of the film sheet 11. The sensor electrodes 12 forming the first circuit pattern 12a and the sensor electrodes 12 forming the second circuit pattern 12b, which are arranged in the manner described above, form operation coordinates for detecting the XY coordinates of a position at which a touch operation is performed.

The base member 20 is laminated and fixed to a surface 10c of the sensor main body 10a of the sensor sheet 10 so as to form an operation surface on which a touch operation is performed. Thus, the sensor sheet 10 and the base member 20 are formed as an integral member. As a result of being formed as an integral member, the sensor main body 10a can be formed into a shape that follows the shape of the base member 20. Thus, although the film sheet 11 is a flat film as a material, the film sheet 11 can be formed in such a manner as to have a three-dimensional operation surface having, for example, a dome-like shape or an arc shape in accordance with the shape of the base member 20. In addition, the sensor sheet 10 is shaped so as to follow not only the shape of the top surface portion 20a of the base member 20 but also the cylindrical shape of the side surface portion 20b of the base member 20. As a result, the sensor sheet 10 can be formed so as to be rounded at corner portions extending from the top surface portion 20a to the side surface portion 20b of the base member 20. Furthermore, the resist layer 15 may be provided on the surface 10c of the sensor main body 10a of the sensor sheet 10 and may be laminated and fixed to the sensor sheet 10 and the base member 20. By using a light-transmitting material as the material of the sensor sheet 10 and the material of the base member 20, the sensor sheet 10 and the base member 20 can allow backlight to pass therethrough.

The top surface portion 20a and the side surface portion 20b of the base member 20 have a joint surface 40 serving as a "joint surface portion" in which the base member 20 is joined to the film sheet 11 of the sensor sheet 10, and as illustrated in the partially enlarged view in FIG. 3A, the film sheet 11 projects from an end 50 of the joint surface 40 so as to form the tail portion 10*b*. In a boundary portion between the tail portion 10*b* and the base member 20, a separation portion 60 serving as a "recess" that is formed as a result of the base member 20 being more recessed than a virtual extension surface that could be formed if the joint surface 40 was further extended is formed at the end 50 of the joint surface 40 formed on the side surface portion 20*b* of the base member 20. The separation portion 60 is included in the base member 20. A portion of the sensor sheet 10 that is located at a position facing the separation portion 60 is a portion of the sensor main body 10*a*. This portion is not fixed to the base member 20 and forms a tail support portion 10*a*1 that supports the tail portion 10*b* such that the tail portion 10*b* is bendable.

Figure 4A:
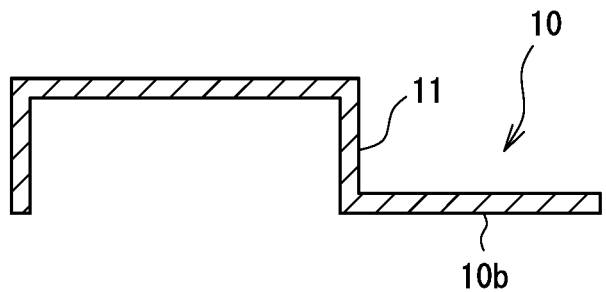
FIG. 4 is a diagram illustrating an example of a method for manufacturing the electrostatic capacitance sensor illustrated in FIG. 1.
Figure 4B:
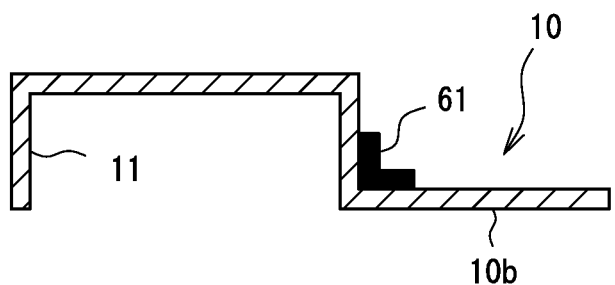
Figure 4C:
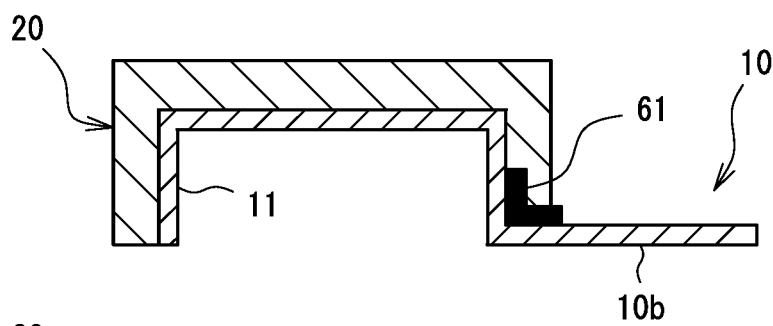
Figure 4D:
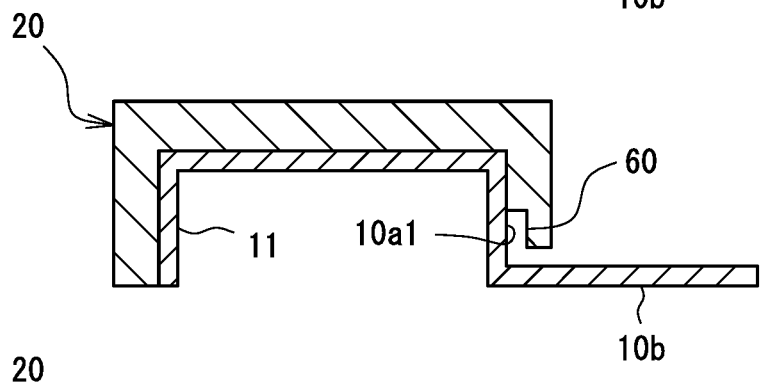
Figure 4E:
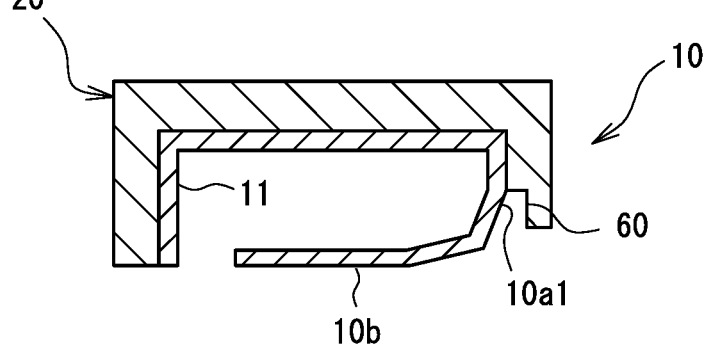

There are a large number of methods for forming the separation portion 60, and one of the methods will be described as an example with reference to FIG. 4. There is a method for disposing a heat-resistant tape 61 or a masking member, such as a print layer, on the front surface 11*a* of the film sheet 11 that corresponds to a portion in which the separation portion 60 is to be formed. Here, a method for manufacturing the sensor sheet 10 by using the heat-resistant tape 61 will be described. First, the sensor electrodes 12, the wiring lines 14, the resist layer 15, and so forth are formed on the planar film sheet 11 by printing or the like, and temporary drawing is performed on the film sheet 11 by vacuum forming or the like so as to form the film sheet 11 into a shape such as that illustrated in FIG. 4A. Next, as illustrated in FIG. 4B, the heat-resistant tape 61 is attached to a portion of the film sheet 11 at which the separation portion 60 is to be formed. The heat-resistant tape 61 attached to the film sheet 11 forms a "masking portion". Then, the film sheet 11 is placed in an injection mold, and a molten resin that forms the base member 20 is injected into the injection mold and solidified, so that the film sheet 11 and the base member 20 are integrally molded as illustrated in FIG. 4C. Subsequently, the heat-resistant tape 61 is removed, so that an integrally molded body including the separation portion 60 formed as a "recess" that is a space having a size approximately the same as the thickness and the area of the heat-resistant tape 61 as illustrated in FIG. 4D is obtained. After that, as illustrated in FIG. 4E, the tail portion 10*b* is bent by bending the tail support portion 10*a*1.

The heat-resistant tape 61 is made of a material that does not melt or soften even at a molding temperature at which the sensor sheet 10 is integrated with the base member 20. Examples of the material include a polyimide resin, a fluorocarbon resin, a silicone resin, glass cloth, various metal foils such as an aluminum foil and a copper foil, and the like.

Alternatively, as the heat-resistant tape 61, for example, a member in which a coating layer made of a heat-resistant polymer composition is provided on a surface of a resin film made of polyethylene terephthalate (PET) resin or the like can be used. Examples of the heat-resistant polymer composition include a silicone-based polymer composition, a fluorosilicone-based polymer composition, and a fluorine-based polymer composition.

In addition, it is preferable that the heat-resistant tape 61 further include a heat-resistant adhesive material provided on a base member made of a material such as those mentioned above. As the adhesive material, for example, an acrylic, a silicone-based, or a fluorine-based adhesive material having a high heat resistance can be used. Note that, in the case where the heat-resistant tape 61 is formed by providing a layer made of a heat-resistant polymer composition on a surface of a resin film, it is preferable that the adhesive material be provided on another surface of the resin film that is opposite to the surface of the resin film on which the layer made of the heat-resistant polymer composition is provided. It is preferable that a surface of the heat-resistant tape 61 be flat and have smoothness so that the molten resin, which forms the base member 20, does not bite or penetrate into the surface.

Note that, in the present embodiment, although the case where the heat-resistant tape 61 is used as the "masking portion" has been described, other tapes may be used. For example, when the influence of the molding time or the molding temperature is small, a general-purpose, non-heat-resistant tape made of a viscous polymer material such as a cellophane tape containing a natural polymer material as its base material or an oriented polypropylene (OPP) tape containing a synthetic polymer material as its base material can be used as one aspect of the "masking portion" of the present invention. In other words, when the molding time is short or when the molding temperature is low, such tapes made of a viscous polymer material does not become fixed to the molten resin, which forms the base member 20, and can be peeled off from the film sheet 20 even if the tapes are not resistant to heat, and thus, each of the tapes can be applied as the "masking portion" when the separation portion 60 is formed.

Returning to the description of the components of the electrostatic capacitance sensor 1, the tail portion 10*b* is a portion that extends from a bottom-surface inner edge 20*d* of the cylindrical side surface portion 20*b* of the base member 20 without being fixed to the base member 20. The tail portion 10*b* projects from the sensor main body 10*a* and includes the terminal portion 13 formed at a projection end thereof. The wiring lines 14 extend from the sensor main body 10*a* of the sensor sheet 10 included in the film sheet 11 to the terminal portion 13 through a side surface 11*c* of the film sheet 11 and the tail portion 10*b*.

More specifically, the first circuit pattern 12*a* of the sensor electrodes 12 is formed on the rear surface 11*b* of the film sheet 11. Thus, the wiring lines 14 extending from the first circuit pattern 12*a* are formed on the rear surface 11*b* of the film sheet 11 so as to extend from the first circuit pattern 12*a* to the terminal portion 13 of the tail portion 10*b*.

In contrast, the second circuit pattern 12*b* is formed on the front surface 11*a* of the film sheet 11. Thus, the wiring lines 14 extending from the second circuit pattern 12*b* are formed on the front surface 11*a* of the film sheet 11 so as to extend from the second circuit pattern 12*b* to through holes 10*b*1 of the tail portion 10*b*. In addition, these wiring lines 14 reach the rear surface 11*b* of the film sheet 11 by extending through the through holes 10*b*1 and are extended to the terminal portion 13.

Accordingly, in the area between the through holes 10*b*1 and the terminal portion 13, all the plurality of wiring lines 14 are formed on the rear surface 11*b* of the film sheet 11. In contrast, in the area between the sensor main body 10*a* and the through holes 10*b*1, some of the plurality of wiring lines 14 are formed on the front surface 11*a* of the film sheet 11, and the rest of wiring lines 14 are formed on the rear surface 11*b* of the film sheet 11.

The material, the function, and so forth of each component of the electrostatic capacitance sensor 1 will now be described.

The film sheet 11 is the base member of the sensor sheet 10 and is formed of a resin film made of a thermoplastic resin. This is because the film sheet 11 that is made of a thermoplastic resin can be easily formed into a shape corresponding to the shape of the base member 20 by being heated. Examples of the material of such a resin film include a polyethylene terephthalate (PET) resin, a polyethylene naphthalate (PEN) resin, a polycarbonate (PC) resin, a polymethylmethacrylate (PMMA) resin, a polypropylene (PP) resin, a polyurethane (PU) resin, a polyamide (PA) resin, a polyethersulfone (PES) resin, a polyether ether ketone (PEEK) resin, a triacetylcellulose (TAC) resin, a polyimide resin (PI), a cycloolefin polymer (COP). In the case where a display unit (not illustrated) that displays any indication such as a symbol, a number, or the like is provided on a rear surface 10d of the sensor sheet 10, it is preferable to use a transparent resin film.

It is preferable that the thickness of the film sheet 11 be 10 μm to 500 μm because the film sheet 11 needs to have rigidity for maintaining its shape, flexibility to be bendable, and the like. The film sheet 11 may be provided with, for example, a primer layer or a surface protection layer for improving the degree of contact between the film sheet 11 and a conductive polymer that is used as the material of the sensor electrodes 12 (described below) or an overcoat layer for the purpose of preventing static charge or the like. Alternatively, the film sheet 11 may be subjected to a surface treatment beforehand.

Each of the sensor electrodes 12 is formed of an electrically conductive layer containing a conductive ink or a conductive polymer. By using a conductive polymer, the sensor electrodes 12 do not break easily even if the sensor electrodes 12 are stretched when the film sheet 11 and the base member 20 are integrally formed. In addition, it is preferable to use a conductive polymer because a coating liquid can be formed, and it can be printed and formed, so that the sensor electrodes 12 can be obtained at a lower cost compared with the case of using ITO or the like. In contrast, in the case where transparency is not necessary, the sensor electrodes 12 can be formed by using an electroconductive ink such as silver ink or carbon paste. Silver ink is preferable because the sensor electrodes 12 having a low resistance and a favorable sensitivity can be formed by using silver ink. In contrast, carbon paste is preferable because the sensor electrodes 12 can be obtained at a lower cost by using carbon paste compared with the case of using a conductive polymer or because carbon paste is highly resistant to weathering.

As the material of the conductive polymer that forms the sensor electrodes 12, a conductive polymer that can form a transparent layer is used. Examples of such a conductive polymer having transparency include polyparaphenylene, polyacetylene, and poly-3,4-ethylenedioxythiophene-polystyrene sulfonic acid (PEDOT-PSS). The layer thickness of each of the sensor electrodes 12 is preferably 0.04 μm to 1.0 μm, and more preferably 0.06 μm to 0.4 μm. If the layer thickness is smaller than 0.04 μm, there is a possibility that the resistance of each of the sensor electrodes 12 may increase, and if the layer thickness exceeds 1.0 μm, there is a possibility that the transparency may decrease. Note that the layer thickness of each of the sensor electrodes 12 can be measured by forming the sensor electrodes 12 on the film sheet 11 and using an atomic force microscope (AFM).

The wiring lines 14 electrically connect the sensor electrodes 12 to the terminal portion 13. It is preferable that the material of the wiring lines 14 be made of a conductive paste or an electroconductive ink containing a highly conductive metal such as copper, aluminum, silver, or an alloy containing these metals. It is preferable that the wiring lines 14 be silver wiring lines because silver has a high conductivity among the above-mentioned metals and alloys and is less likely to be oxidized than copper is.

It is preferable that the thickness of each of the wiring lines 14 be 1.0 μm to 20 μm. If the thickness of each of the wiring lines 14 is smaller than 1.0 μm, the resistance of the wiring line 14 is likely to increase, and this may cause noise. On the other hand, if the thickness of each of the wiring lines 14 exceeds 20 μm, large step portions are formed, and thus, it is very likely that air bubbles will be trapped between the sensor sheet 10 and the resist layer 15 when the resist layer 15 is applied. In the case where air bubbles are trapped, there is a problem in that the air bubbles burst such that holes are formed and that the highly conductive metal contained in the wiring lines 14 may easily be corroded. In addition, it is preferable that the resistance of each of the wiring lines 14 be 300Ω or less. If the resistance of each of the wiring lines 14 exceeds 300Ω, there is a possibility that noise will increase, which in turn results in deterioration of the sensitivity.

The terminal portion 13 is a connection portion that electrically connects the electrostatic capacitance sensor 1 to the connector 31 of the circuit board 30. The terminal portion 13 can be formed by, for example, covering the ends of the wiring lines 14 with a carbon ink.

The resist layer 15 is a protective film having an insulating property and is provided in order to prevent the sensor electrodes 12 that are adjacent to each other from being electrically connected to each other and in order to protect the sensor electrodes 12 from ultraviolet rays, scratches, and so forth. The resist layer 15 is transparent. In addition, the resist layer 15 has a function of preventing corrosion of the wiring lines 14 made of a silver paste or a metal. A hard resin is selected as the resin that forms the resist layer 15, and for example, acrylic, urethane-based, epoxy-based, and polyolefin-based resins and other resins can be used. The thickness of the resist layer 15 is usually 6 μm to 30 μm, and preferably 10 μm to 20 μm. This is because, if the thickness of the resist layer 15 exceeds 30 μm, there is a possibility that the flexibility will deteriorate, and if the thickness is smaller than 6 μm, there is a possibility that protection of the sensor electrodes 12 will be insufficient.

Operations and effects of the electrostatic capacitance sensor 1 of the present embodiment will now be described except for those that have been already described.

Figure 5:
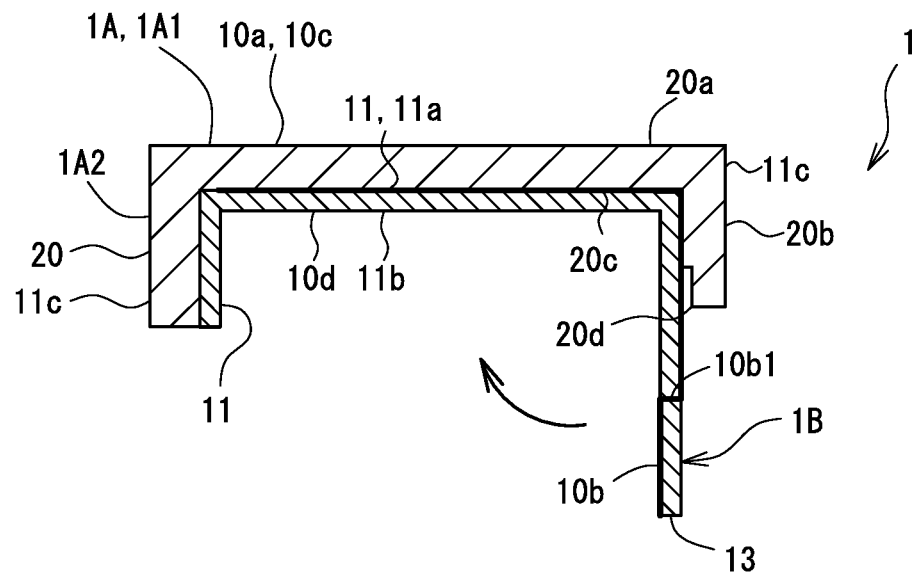
FIG. 5 is a sectional view corresponding to FIG. 3A in a state where a tail portion illustrated in FIG. 3A is bent downward.
Figure 6:
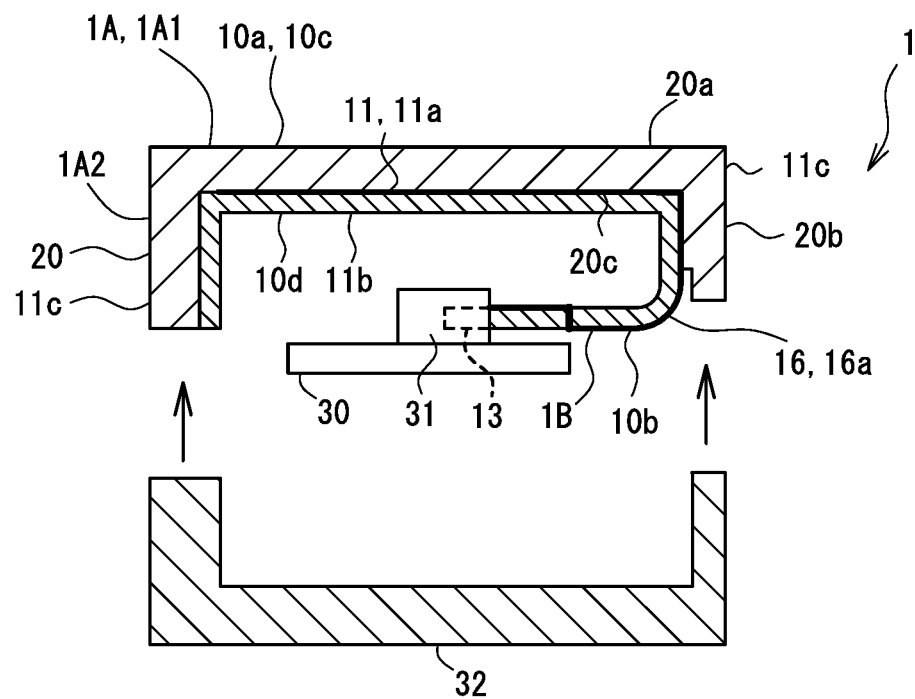
FIG. 6 is a sectional view corresponding to FIG. 3A in a state where the tail portion illustrated in FIG. 5 is bent to the rear surface of a base member.

In general, in a normal molding method such as integral molding or insert molding, the film sheet 11 and the base member 20 are fixed to each other on the entire laminated surface thereof. Thus, as illustrated in FIG. 3A, the tail portion 10b, on which the wiring lines 14 are arranged, can be easily formed so as to be in a state of being extended to the side of the base member 20. On the other hand, it is difficult to extend the tail portion 10b in any direction, such as a downward direction or an inward direction, having an angle of 90 degrees or larger with respect to the direction in which the film sheet 11 is extended. However, as a result of the film sheet 11 of the sensor sheet 10 having the separation portion 60 that is not fixed to the base member 20, the tail portion 10b that is easily bendable in any direction can be obtained. In other words, the tail portion 10b can be bent downward along the side surface portion 1A2 as illustrated in FIG. 5, and in addition, the tail portion 10b can be easily bent in such a manner as to be accommodated inside the base member 20 as illustrated in FIG. 6.

In the electrostatic capacitance sensor 1, since the tail portion 10b is spaced apart from the bottom-surface inner edge 20d of the base member 20 by an amount equal to the thickness of the separation portion 60, the tail portion 10b can be easily disposed so as to be bent toward a bottom surface portion 20c of the base member 20 as described above. Thus, the entire electrostatic capacitance sensor 1 can be reduced in size including the arrangement of the tail portion 10b.

The base member 20 can be configured as a first divided housing of an electronic device. A second divided housing 32 can be combined with the base member 20 through an opening 20e of the base member 20. An accommodation space is formed in a housing that is formed by combining the first divided housing (base member 20) and the second divided housing 32 together. The circuit board 30 can be disposed in the accommodation space. The terminal portion 13 of the tail portion 10b can be connected to connector 31 in the housing.

Since the sensing unit 1A has a three-dimensional shape having the top surface portion 1A1 and the side surface portion 1A2, measures can be taken against the three-dimensional shape of the electrostatic capacitance sensor 1 to improve the design. For example, the top surface portion 1A1 of the sensing unit 1A that serves as an operation surface can be formed so as to have a plane shape, a curved surface shape, or the like. The side surface portion 1A2 can be formed so as to have a columnar shape, the shape of a polygonal columnar outer peripheral surface, or the like. Alternatively, the top surface portion 1A1 and the side surface portion 1A2 can be smoothly connected to each other so as to form, for example, a dome-like shape.

The resist layer 15 can protect the sensor electrodes 12 and the wiring lines 14 with certainty. In addition, the resist layer 15 can insulate the sensor electrodes 12 from one another with certainty.

Figure 7:
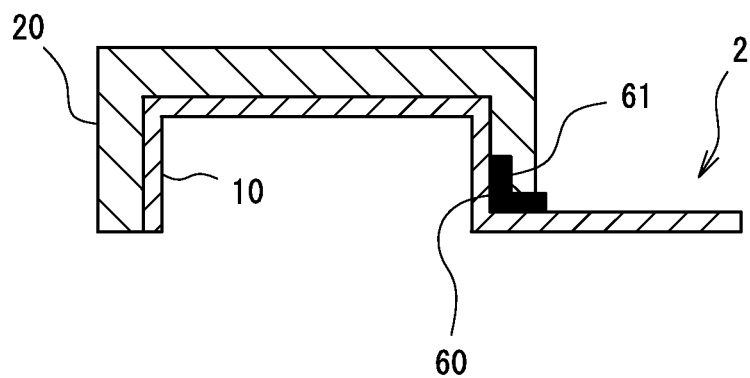
FIG. 7 is a diagram illustrating an electrostatic capacitance sensor according to a first modification of the first embodiment.

First Modification of First Embodiment [FIG. 7]

FIG. 7 illustrates a sectional view of an electrostatic capacitance sensor 2 according to a first modification of the first embodiment. In the electrostatic capacitance sensor 2, the heat-resistant tape 61 is not removed and is left as is in the electrostatic capacitance sensor 2. By leaving the heat-resistant tape 61 as is instead of peeling it off, the heat-resistant tape 61 serves as the separation portion 60, and an interface between the heat-resistant tape 61 and the base member 20 may easily be separated. The rest of the configuration of the electrostatic capacitance sensor 2 is similar to that of the electrostatic capacitance sensor 1.

Figure 8:
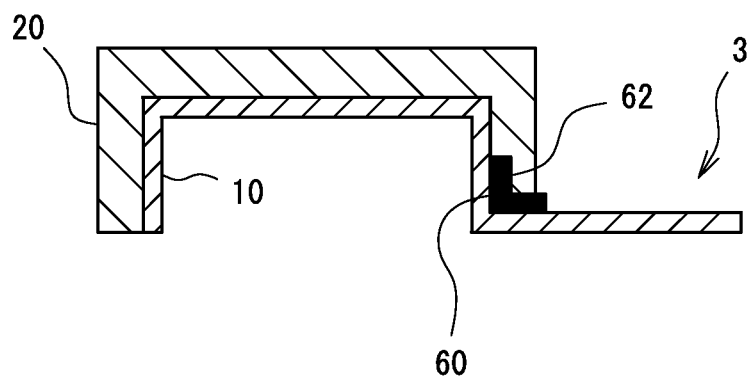
FIG. 8 is a diagram illustrating an electrostatic capacitance sensor according to a second modification of the first embodiment.

Second Modification of First Embodiment [FIG. 8]

FIG. 8 illustrates a sectional view of an electrostatic capacitance sensor 3 according to a second modification of the first embodiment. As an alternative to the heat-resistant tape 61 used in the electrostatic capacitance sensor 2 according to the above-described first modification and as an alternative method, a method of applying a heat-resistant coating material to the front surface 11a of the film sheet 11 can be employed. A coating layer 62 that is applied to and cured on the front surface 11a of the film sheet 11 forms the "masking portion". As the heat-resistant coating material, for example, a heat-resistant coating material obtained by containing an inorganic filler in a fluorine-based or silicone-based base can be used. Alternatively, a thermosetting or ultraviolet-ray-curing coating material may be used. By leaving the coating layer 62 as is instead of removing it, the coating layer 62 serves as the separation portion 60, and an interface between the coating layer 62 and the base member 20 may easily be separated. The rest of the configuration of the electrostatic capacitance sensor 3 is similar to that of the electrostatic capacitance sensor 2.

Figure 9:
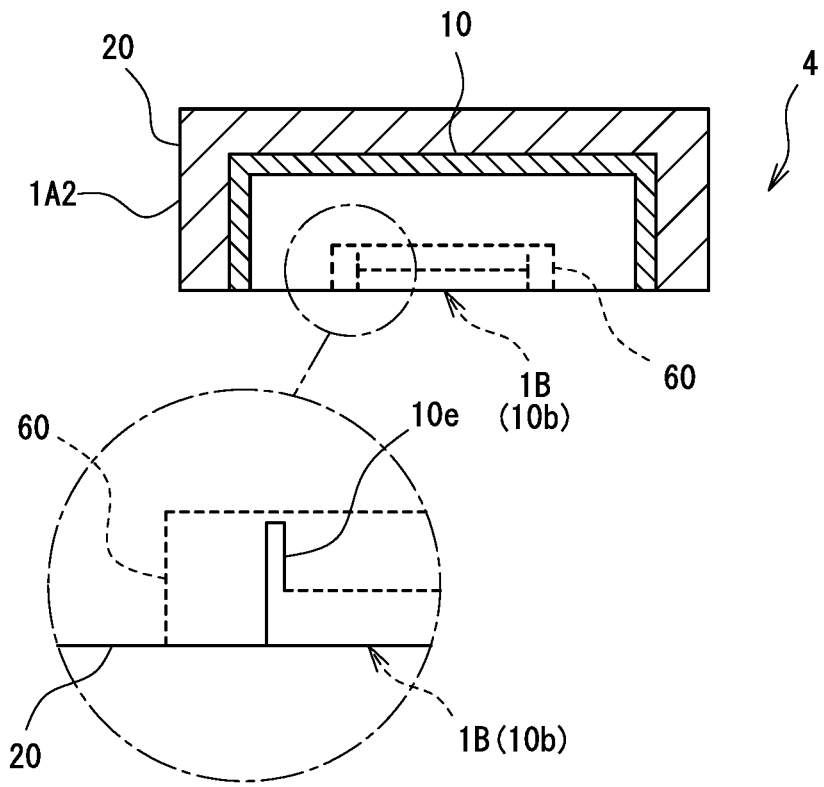
FIG. 9 is a cross-sectional view corresponding to FIG. 3B and illustrating an electrostatic capacitance sensor according to a second embodiment.

Second Embodiment [FIG. 9]

Figure 3B:
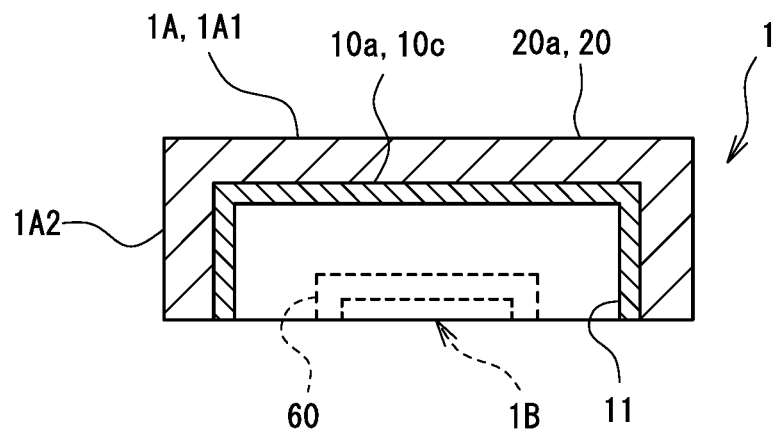
FIG. 3B is a cross-sectional view of the electrostatic capacitance sensor taken along line IIIB-IIIB of FIG. 1.

An electrostatic capacitance sensor 4 of the second embodiment has notches 10e formed in a portion of the sensor sheet 10 that faces the separation portion 60. The configuration of the electrostatic capacitance sensor 4, excluding the above, is similar to that of the electrostatic capacitance sensor 1. FIG. 9 illustrates a cross-sectional view of the electrostatic capacitance sensor 4 having the notches 10e. Compared with the electrostatic capacitance sensor 1 of the first embodiment that is illustrated in FIG. 3B and that does not have the notches 10e, the tail portion 10b is more easily bent toward the inside of the base member 20.

Each of the notches 10e needs to have a thickness without any gap so that the molten resin, which forms the base member 20, does not enter the notch 10e. The notches 10e each having a large width are not preferable because, in this case, there is a possibility that the molten resin will enter the notches 10e and will be fixed to the sensor sheet 10. It is preferable that the masking portion and the heat-resistant tape 61 be arranged so as to cover the notches 10e. This is because, in this case, the molten resin can be easily prevented from entering the notches 10e when the base member 20 is integrally formed with the sensor sheet 10. The masking portion and the heat-resistant tape 61 can also be peeled off and removed after integral molding as in the electrostatic capacitance sensor 2 according to the first modification of the first embodiment. In the sensor sheet 10, not only the tail portion 10b projecting from a lower end of the side surface portion 1A2 but also a portion of the film sheet 11 that is sandwiched between the notches 10e in a portion facing the side surface portion 1A2 are separated from the base member 20 and can be bent and extended toward the inside of the base member 20 by the length by which the notches 10e are formed.

Other Modifications

In the above-described embodiment, although the electrostatic capacitance sensor 1 that includes the tail portion 10b projecting outward from the sensor main body 10a and in which the surface 10c of the sensor sheet 10 is covered with the base member 20 in the sensor main body 10a, which is formed in a protruding shape by drawing, has been described, the length of the tail portion 10b may be set in such a manner that the tail portion 10b is small enough to be fitted into an area inside the side surface portion 20b of the base member 20. However, the tail portion 10b needs to be electrically connected to connector 31 at a position spaced away from the side surface portion 20b. Accordingly, the notches 10e are provided, and the portion sandwiched between the notches 10e is configured to serve as the tail portion 10b.

Figure 10:
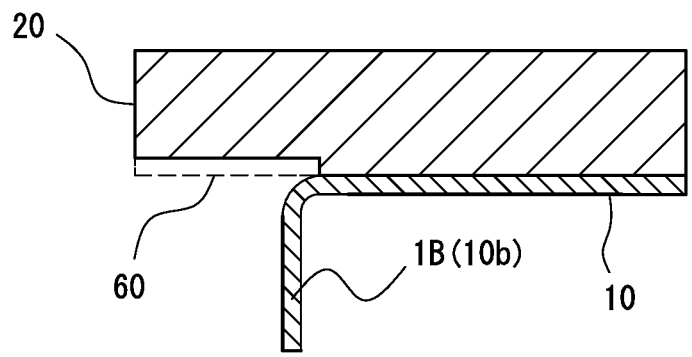
FIG. 10 is a diagram illustrating a portion in which a base member and a sensor sheet are coupled to each other in an electrostatic capacitance sensor according to another modification.

The shape and the orientation of a portion in which the sensor sheet 10 and the base member 20 are joined together are not particularly limited, and the separation portion 60 may be formed between the base member 20 and the sensor sheet 10 provided at the lower end of the base member 20 as illustrated in FIG. 10.

The above-described embodiments are examples of the present invention, and for example, the embodiments can be changed or combined, or well-known techniques can be added to the embodiments within the scope of the present invention, and obtained technologies are also included in the scope of the present invention. For example, the wiring lines 14 arranged at the two ends of the tail portion 10b may be provided on either the front surface 11a or the rear surface 11b of the film sheet 11.

Each of the electrostatic capacitance sensors 1, 2, and 3 of the above-described embodiments may include a decorative layer that includes a display portion displaying, for example, a color, a character, a number, or a symbol. The resist layer 15 may be configured as a decorative layer, and in this case, a protective layer that protects the decorative layer may be provided.

REFERENCE SIGNS LIST 1 electrostatic capacitance sensor (sensor, first embodiment)
1A sensing unit
1A1 top surface portion
1A2 side surface portion
1B wiring connection portion
2 electrostatic capacitance sensor (sensor, first modification of first embodiment)
3 electrostatic capacitance sensor (sensor, second modification of first embodiment)
4 electrostatic capacitance sensor (sensor, second embodiment)
10 sensor sheet
10a sensor main body
10a1 tail support portion
10b tail portion
10b1 through hole
10c front surface
10d rear surface
10e notch
11 film sheet
11a front surface
11b rear surface
11c side surface
12 sensor electrode
12a first circuit pattern
12b second circuit pattern
13 terminal portion
14 wiring line
15 resist layer
16 bent portion
16a outer bent surface
16b inner bent surface
20 base member
20a top surface portion
20b side surface portion
20c bottom surface portion
20d bottom-surface inner edge
20e opening
30 circuit board
31 connector
32 second housing
40 joint surface
50 end of joint surface
60 separation portion
61 heat-resistant tape (masking portion, heat-resistant resin member)
62 coating layer (masking portion, heat-resistant resin member)

The invention claimed is:

1. A sensor comprising:
a base member; and
a sensor sheet,
wherein the sensor sheet includes
a sensor main body that includes at least one sensor electrode,
a tail portion that includes a wiring line electrically connected to the at least one sensor electrode and that projects and extends with respect to the base member,
wherein the base member includes a joint surface portion that is fixed to the sensor main body, and
wherein the sensor further comprises a separation portion that is defined between the base member and the sensor sheet, and a part of the sensor sheet at the separation portion is not fixed to the base member.

2. The sensor according to claim 1,
wherein the separation portion is a recess that is formed by being recessed with respect to the joint surface portion.

3. The sensor according to claim 1,
wherein a heat-resistant resin member that is interposed between the tail support portion and the base member serves as the separation portion.

4. The sensor according to claim 1,
wherein the sensor sheet has two notches formed in a portion of the sensor sheet so as to extend along an outer edge of the tail portion, and
wherein a portion facing the separation portion of the sensor sheet that is sandwiched between the two notches faces the separation portion.

5. The sensor according to claim 1,
wherein the sensor main body has a three-dimensional shape having a top surface portion and a side surface portion.

6. The sensor according to claim 1,
wherein a film sheet on the sensor sheet and the base member are each made of a light-transmitting material, and
wherein the film sheet and the sensor sheet are capable of illuminating by allowing backlight to pass the sensor sheet.

7. The sensor according to claim 1,
wherein the plurality of the sensor electrodes are electrodes for an electrostatic capacitance sensor that detects a change in electrostatic capacitance.

8. The sensor according to claim 1,
wherein only one surface of the sensor main body is laminated and fixed to the base member, and another surface of the sensor main body is free.

9. The sensor according to claim 1,
wherein the base member comprises a top surface portion and a cylindrical side surface portion.

10. The sensor according to claim 9,
wherein the tail portion is disposed so as to face the inside of the side surface portion.

11. The sensor according to claim 9,
wherein the separation portion is provided on a lower end side of an inner peripheral surface of the side surface portion.

12. The sensor according to claim 9,
wherein the sensor main body is laminated and fixed to the top surface portion of the base member and the side surface portion of the base member.

13. A method for manufacturing a sensor that includes a base member and a sensor sheet and in which the base member, which is made of a resin material, is integrally formed with the sensor sheet, the sensor sheet including a sensor main body that includes a sensor electrode and a tail portion that includes a wiring line electrically connected to the sensor electrode and that projects and extends with respect to the base member, the method comprising:
providing a masking portion that is not fixed to the resin material on a tail support portion of the sensor main body to which the tail portion is connected between a part of the sensor sheet that overlaps the base member and the base member;

integrally forming the base member such that the base member covers the masking portion; and bending the tail portion with respect to the base member by bending the tail support portion.

14. The method for manufacturing a sensor according to claim 13, wherein the masking portion is a heat-resistant tape.

15. The method for manufacturing a sensor according to claim 14, wherein the heat-resistant tape is peeled off and removed after the base member has been integrally formed.

16. The method for manufacturing a sensor according to claim 13, wherein the masking portion is a coating layer made of a heat-resistant coating material.

17. The method for manufacturing a sensor according to claim 13, wherein the masking portion is a tape made of a viscous polymer material.

\* \* \* \* \*